United States Patent
Tsunoda et al.

(10) Patent No.: US 7,288,813 B2
(45) Date of Patent: Oct. 30, 2007

(54) DIRECT TUNNELING SEMICONDUCTOR MEMORY DEVICE AND FABRICATION PROCESS THEREOF

(75) Inventors: Kouji Tsunoda, Kawasaki (JP); Tatsuya Usuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 268 days.

(21) Appl. No.: 11/012,277

(22) Filed: Dec. 16, 2004

(65) Prior Publication Data

US 2006/0043464 A1 Mar. 2, 2006

(30) Foreign Application Priority Data

Sep. 2, 2004 (JP) ............................. 2004-255785

(51) Int. Cl.
*H01L 29/788* (2006.01)
(52) U.S. Cl. ....................................... 257/316; 257/321
(58) Field of Classification Search ................ 257/316, 257/321, 510
See application file for complete search history.

(56) References Cited

U.S. PATENT DOCUMENTS

| 6,195,292 | B1 | 2/2001 | Usuki et al. | |
|---|---|---|---|---|
| 6,713,826 | B2 * | 3/2004 | Uehara et al. | ............... 257/410 |

FOREIGN PATENT DOCUMENTS

| JP | 11-103052 | 4/1999 |
|---|---|---|
| JP | 2000-150680 | 5/2000 |
| JP | 2002-16155 | 1/2002 |
| JP | 2002-231824 | 8/2002 |
| JP | 2004-273643 A | 9/2004 |

OTHER PUBLICATIONS

Tatsuya Usuki et al., "Advantage of a Quasi-Nonvolatile Memory with Ultra Thin Oxide", Extended Abstracts of the 2001 International Conference on Solid State Devices and Materials, Tokyo, 2001, pp. 532-533.

* cited by examiner

*Primary Examiner*—Mark V. Prenty
(74) *Attorney, Agent, or Firm*—Westerman, Hattori, Daniels & Adrian, LLP.

(57) ABSTRACT

A direct-tunneling semiconductor memory device includes a device isolation structure formed on a semiconductor substrate, including a device isolation trench and a device isolation insulation film filling the device isolation trench, a dielectric film covering both sidewall surfaces and a top surface of a floating gate electrode formed on the semiconductor substrate, a conductive part provided on the sidewall surfaces of the floating gate electrode via the dielectric film, the conductive part constituting a part of a control gate electrode, and first and second diffusion regions formed at respective lateral sides of the floating gate electrode, wherein the first and second diffusion regions are formed on a surface of the device isolation groove with offset from a region right underneath the floating gate electrode, the conductive part is formed in the device region with offset from the device isolation trench.

10 Claims, 12 Drawing Sheets

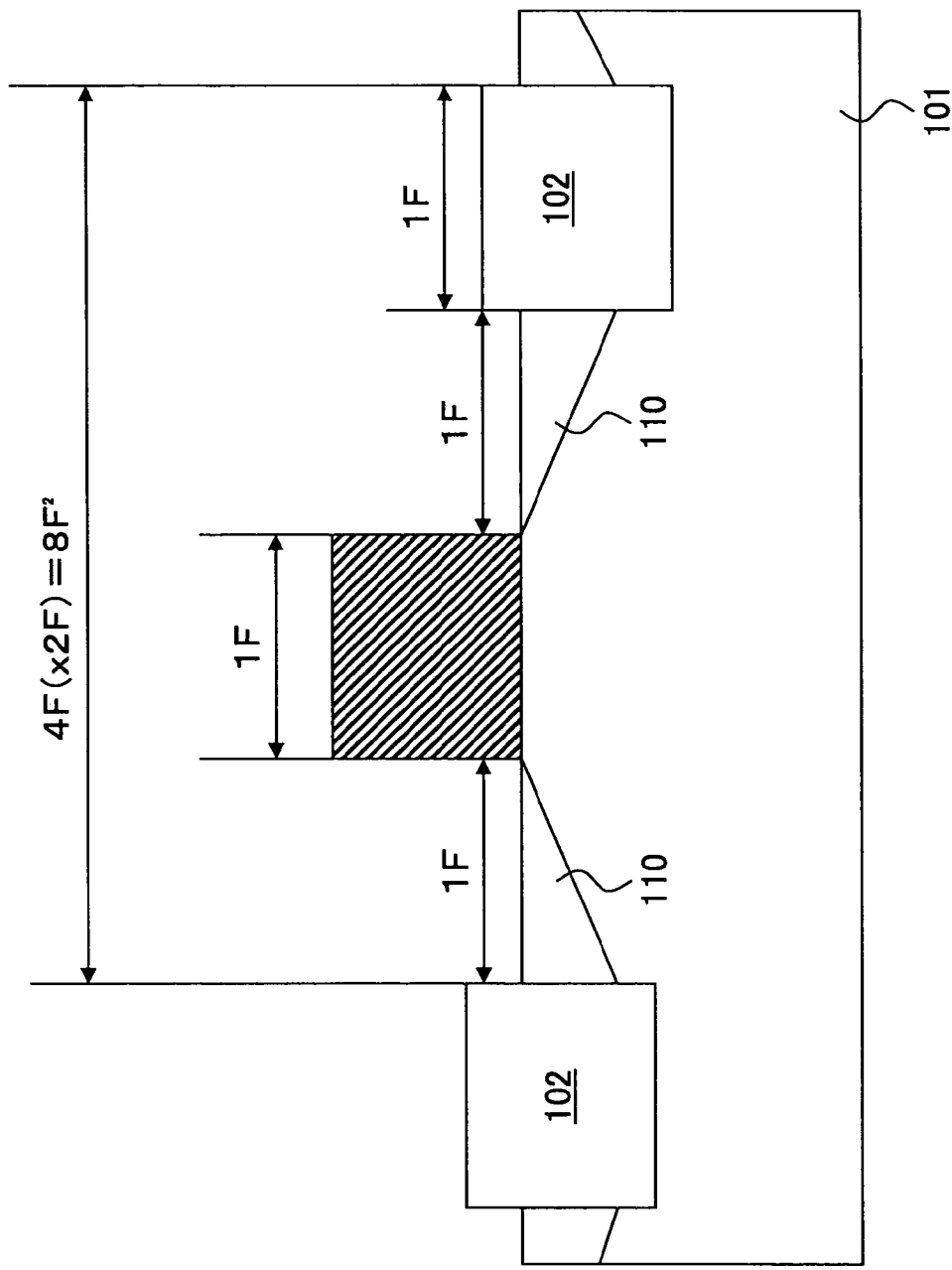

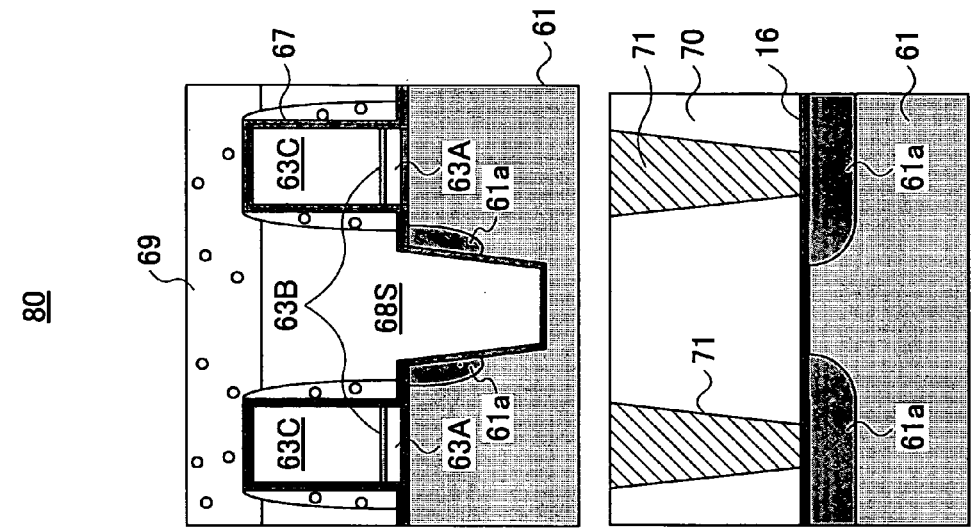
FIG.8B
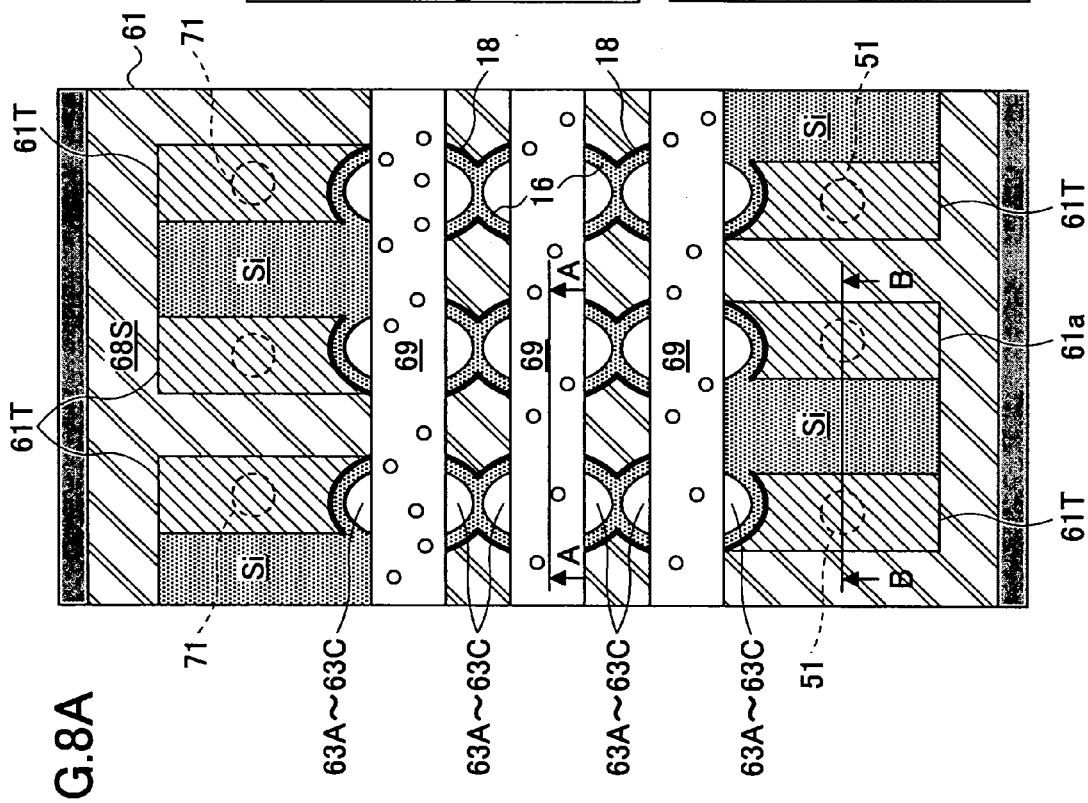
FIG.8C
FIG.8A

DIRECT TUNNELING SEMICONDUCTOR MEMORY DEVICE AND FABRICATION PROCESS THEREOF

CROSS-REFERENCE TO RELATED APPLICATION

The present application is based on Japanese priority application No.2004-255785 filed on Sep. 2, 2004, the entire contents of which are hereby incorporated by reference.

BACKGROUND OF THE INVENTION

The present invention generally relates to semiconductor devices and more particularly to a direct-tunneling semiconductor memory device that stores information by injecting carriers into a floating gate by direct-tunneling of carriers and the fabrication process thereof.

A flash memory is a non-volatile semiconductor memory device having a simple structure in that a single MISFET constitutes a single memory cell and is used in various applications.

More specifically, a flash memory is a semiconductor memory device having a floating gate electrode provided on a channel region via a tunneling insulation film and has a control gate electrode formed in capacitive coupling with the floating gate electrode. Thus, a flash memory holds information in the floating gate electrode in the form of electric charges by injecting hot electrons induced in the channel region into the floating gate electrode through the tunneling insulation film.

Thus, in order to hold the electric charges thus injected into the floating gate electrode and to achieve the desired non-volatile memory operation, a flash memory uses a relatively thick tunneling insulation film typically having the thickness of 8-10 nm.

Thereby, injection of hot electrons is achieved by applying a writing voltage of 5-6V or higher to the control gate electrode. At the time of erasing the information, on the other hand, a high erasing voltage of 10-20V is applied to the control gate electrode and deformation of band structure is induced in the tunneling insulation film. Thereby, the electric charges injected into the floating gate electrode are withdrawn from the floating gate electrode in the form of Fowler-Nordheim (F-N) tunneling current.

With such a conventional flash memory that uses hot electrons injected into the floating gate electrode, on the other hand, there exists a problem in that most of the excited hot electrons are absorbed by the drain region of the device in the form of drain current, and only a small portion of the hot electrons are injected into the floating gate electrode. Thus, conventional flash memory has suffered from the problem of poor carrier injection efficiency and large power consumption. Further, with such a conventional flash memory, there exists another problem in that it takes a long time, at the time of erasing the written information, for pulling out the injected electrons through the thick tunneling insulation film in the form of the FN tunneling current. Thus, a conventional flash memory suffers from the problem of slow operational speed, particularly very slow erasing operation.

On the other hand, in the case retention (non-volatility) of written information is not important, it becomes possible to reduce the thickness of the tunneling insulation film, and thus, it becomes possible to realize a so-called direct-tunneling memory (DTM), in which injection and withdrawal of carriers is achieved through a thin tunneling insulation film by direct-tunneling phenomenon. Reference should be made to Patent Reference 1 or Non-Parent Reference 1.

Because such a direct-tunneling semiconductor memory device operates with high speed at low voltage, use thereof for replacing SRAMs or DRAMs is contemplated.

While non-volatility of written information is not important with a direct-tunneling semiconductor memory device, it is still preferable to hold the information, and thus the electric charges injected into the floating gate electrode. Because of this, a direct-tunneling semiconductor memory device requires a refreshing operation similar to one used in a DRAM.

In order to decrease the frequency of refreshing operation as much as possible and to realize so-called pseudo-non-volatile operation, it is practiced in a direct-tunneling semiconductor memory device to form the source and drain diffusion regions offset in the silicon substrate from the region right underneath the floating gate electrode, such that leakage of the electric charges from the floating gate electrode to the source region or drain region is suppressed as much as possible.

FIG. 1 shows the construction of such a conventional direct-tunneling semiconductor memory device 100.

Referring to FIG. 1, the direct-tunneling semiconductor memory device 100 is formed on a device region defined on a silicon substrate 101 by a device isolation region 102 of LOCOS oxide film, or the like, and includes a very thin tunneling insulation film 103 having the thickness of 2-3 nm formed on the silicon substrate 101, a floating gate electrode 105 formed on the tunneling insulation film 103, and an upper control gate electrode 107 formed on the floating gate electrode 105 via an insulation film 106 in capacitive coupling with the floating gate electrode 105.

Further, the sidewall surfaces of the stacked gate electrode structure, which is formed of the floating gate electrode 105, the insulation film 106 and the upper control gate electrode 107, are covered with an insulation film 106S similar to the insulation film 106, and there are provided lateral control gate electrodes 108 at the respective outer sides of the insulation films 106S in capacitive coupling with the floating gate electrode 105 via the insulation films 106S. Further, the outer sidewall surfaces of the lateral control gate electrodes 108 are covered with sidewall insulation films 109, respectively.

Further, with this direct-tunneling semiconductor memory device 100 of conventional art, diffusion regions 110 are formed in the silicon substrate 101 at the both lateral sides of the stacked gate electrode structure as the source and drain regions, with offset from the floating gate electrode 105. Thereby, the diffusion regions 110 do not penetrate into the part of the substrate 101 right underneath the floating gate electrode 105.

Thus, with the foregoing direct-tunneling semiconductor memory device, escaping of the electric charges from the floating gate electrode 105 through the thin tunneling insulation film 103 is suppressed, and the direct-tunneling semiconductor memory device 100 of FIG. 1 shows pseudo non-volatility.

Table 1 below shows typical examples of operation of the direct-tunneling semiconductor memory device 100.

TABLE 1

| Operational voltage (V) | Control gate | Drain | Source | Substrate |
|---|---|---|---|---|
| Write voltage (V) | 5 | 0 | 0 | 0 |
| Erase voltage (V) | −5 | 0 | 0 | 0 |
| Read Voltage (V) | 1 | 1 | 0 | 0 |

Referring to Table 1, it will be noted that writing of information can be achieved by merely applying a voltage of about +5V to the control gate electrodes (CG) 107 and 108 while grounding the source region S and drain region D. Further, it will be noted that erasing can be achieved by merely applying a voltage of about −5V to the control gate electrodes 107 and 108.

At the time of reading, a read voltage of about +1V is applied to the control gate electrodes 107 and 108 while grounding the source region S and applying a drive voltage of +1V to the drain region D. In Table 1, "substrate" represents the substrate biasing.

Thus, with a direct-tunneling semiconductor memory device, there is no need of using a high voltage as is used in the conventional stacked type flash memory at the time of writing or erasing operation, and with this, it becomes possible to eliminate the high voltage circuit.

Because a direct-tunneling semiconductor memory device is not a normal non-volatile memory device, the information held therein is erased naturally with time as a result of dissipation of the electric charges. On the other hand, the device does have pseudo non-volatility, it becomes necessary in such a device to carry out erasing operation shown in Table 1 for achieving high-speed rewriting.

(Patent Reference 1) Japanese Laid-Open Patent Application 2002-16155 official gazette (Patent Reference 2) Japanese Laid-Open Patent Application 2000-150680 official gazette (Patent Reference 3) U.S. Pat. No. 6,165,292

(Non-patent Reference 1) Usuki, T., et al., Advantage of a quasi-nonvolatile memory with ultra thin oxide, SSDM2001, p. 532 2001

SUMMARY OF THE INVENTION

FIG. 2 is a diagram schematically showing the relationship between the cell size of the direct-tunneling semiconductor memory device 100 of FIG. 1 and the design rule used for designing the memory device 100.

Referring to FIG. 2, the direct-tunneling semiconductor memory device 100 of FIG. 1 has a size of about 4 F in the illustrated cross section. Taking into account the depth of 2 F, the device 100 of FIG. 1 has a cell size of about 8 $F^2$ (=4 F×2 F), wherein F represents the reference size used with the design rule under consideration.

As noted previously, replacing of SRAMs and DRAMs with direct-tunneling semiconductor memory device 100 is contemplated in view of the prospect of further device miniaturization that may be achieved with the use of a direct-tunneling semiconductor memory device. It should be noted that a direct-tunneling semiconductor memory device does not use a memory cell capacitor, contrary to a DRAM, in which further device miniaturization is difficult because of the use of such a memory cell capacitor. Further, with further device miniaturization, further increase of operational speed is expected with such a direct-tunneling semiconductor memory device.

On the other hand, the conventional direct-tunneling semiconductor memory deice 100 of FIG. 1 uses a LOCOS film 102 for the device isolation, and thus, the efficiency of utilization of the device area is inherently poor. There is a limitation of device miniaturization with the direct-tunneling semiconductor memory device of FIG. 1.

Accordingly, it is a general object of the present invention to provide a novel and useful semiconductor memory device and the fabrication process thereof wherein the foregoing problems are eliminated.

Another and more specific object of the present invention is to provide a direct-tunneling semiconductor memory device having a device structure suitable of minimizing the device area and the fabrication process of such a direct-tunneling semiconductor memory device.

In a first aspect of the present invention, there is provided a direct-tunneling semiconductor memory device, comprising:

a semiconductor substrate;

a device isolation structure formed on said semiconductor substrate, including a device isolation trench formed in said semiconductor substrate and a device isolation insulation film filling said device isolation trench, said device isolation structure defining a device region on a semiconductor substrate surface;

a tunneling insulation film formed on said semiconductor substrate surface in correspondence to said device region;

a floating gate electrode formed on said tunneling insulation film;

a dielectric film covering both sidewall surfaces and a top surface of said floating gate electrode;

a conductive part provided on said sidewall surfaces of said floating gate electrode via said dielectric film, said conductor part constituting a part of a control gate electrode; and first and second diffusion regions formed in said device region at respective lateral sides of said floating gate electrode, said first and second diffusion regions being formed in said device region on a surface of said device isolation groove with offset from a region right underneath said floating gate electrode, said conductive part being formed in said device region with offset from said device isolation trench.

In another aspect, there is provided a method of fabricating a direct-tunneling semiconductor memory device, comprising the steps of:

forming a tunneling insulation film on a semiconductor substrate;

forming a floating gate electrode on said tunneling insulation film;

forming a dielectric film on a sidewall surface of said floating gate electrode;

forming a conductor pattern constituting a part of a control gate electrode on said sidewall surface of said floating gate electrode via said dielectric film;

forming an insulation pattern so as to cover said floating gate electrode including said conductor pattern and so as to expose a part of said semiconductor substrate forming a device isolation region;

etching said semiconductor substrate while using said insulation pattern as a mask to form a device isolation trench;

depositing a device isolation insulation film on said semiconductor substrate so as to fill said device isolation trench and so as to cover said floating gate electrode and said conductor pattern;

etching back said device isolation insulation film until said conductor pattern is exposed; and forming another conductor pattern on said insulation film constituting said control gate electrode such that said another conductor pattern makes contact with said conductor pattern.

In another aspect of the present invention, there is provided an AND-type semiconductor memory integrated circuit comprising a semiconductor substrate and a plurality of memory cell transistors forming an array on said semiconductor substrate, each of said plurality of memory cell transistors comprising:

a device isolation structure formed on said semiconductor substrate, including a device isolation trench formed in said semiconductor substrate and a device isolation insulation film filling said device isolation trench, said device isolation structure defining a device region on a semiconductor substrate surface;

a tunneling insulation film formed on said semiconductor substrate surface in correspondence to said device region;

a floating gate electrode formed on said tunneling insulation film;

a dielectric film covering both sidewall surfaces and a top surface of said floating gate electrode;

a conductive part provided on said sidewall surfaces of said floating gate electrode via said dielectric film, said conductor part constituting a part of a control gate electrode; and source and drain regions formed in said device region at respective lateral sides of said floating gate electrode, said source and drain regions being formed in said device region on a surface of said device isolation groove with offset from a region right underneath said floating gate electrode, said conductive part being formed in said device region with offset from said device isolation trench, a control gate electrode of a memory cell transistor in said array being connected to a control gate electrode of a memory cell transistor of said array adjacent in a row direction on said semiconductor substrate, a source region of a memory cell transistor in said array extending to a source region of a memory cell transistor of said array adjacent in a column direction on said semiconductor substrate, a drain region of a memory cell transistor in said array extending to a drain region of a memory cell transistor of said array adjacent in a column direction on said semiconductor substrate.

Thus, the semiconductor memory device of the present invention forms a direct-tunneling semiconductor memory device that stores information in the floating gate electrode in the form of electric charges as the electric charges are injected to the floating gate electrode through the tunneling insulation film from the source/drain region in the form of direct tunneling current.

According to the present invention, in which the source and drain regions are formed on the sidewall surfaces of the device isolation trench constituting a device isolation structure (STI region) with offset from the region right underneath the floating gate electrode, tunneling of carriers through the tunneling insulation film from the floating gate electrode to the source/drain diffusion region or from the source/drain diffusion region to the floating gate electrode is suppressed effectively, even in the case a very thin silicon oxide film having a thickness of several nanometers or less is used for the tunneling insulation film. Thereby, dissipation of the carriers from the floating gate electrode or erroneous injection of carries into the floating gate electrode is suppressed.

This means also that it is possible with the semiconductor memory device of the present invention to use a tunneling insulation film having a thickness of 3 nm or less, and with this, a semiconductor memory device performing pseudo non-volatile operation with high-speed and low voltage is obtained.

Particularly, with the present invention, it becomes possible to reduce the cell size from the conventional cell size of 8 $F^2$ to 4 $F^2$ by using the STI structure for the device isolation structure and by forming the source and drain regions on the sidewall surfaces of the device isolation trench constituting the STI device isolation structure. With this, it becomes possible to achieve device integration on a semiconductor substrate with large integration density.

By forming the source and drain regions on the sidewall surfaces of the device isolation trench in the present invention such that each of the source and drain regions extends from the substrate surface toward the bottom of the device isolation trench along the trench sidewall surface, the source and drain regions supply and collect the carriers along the channel region at the substrate surface similarly to an ordinary transistor.

Further, by constituting the floating gate electrode in the form of a first floating gate electrode adjacent to the tunneling insulation film and a second floating gate electrode separated from the first floating gate electrode by another tunneling insulation film, and by doping the second floating gate electrode with an impurity element identical in the conductivity type with the impurity element used for the first floating gate electrode but with increased dose, there is induced a band bending in the conduction band and valence band of the first floating gate electrode, while such band banding in the first floating gate electrode induces partial depletion of carriers therein. Thereby, the carriers injected into the floating gate electrode as information are accumulated primarily in the second floating gate electrode provided with large distance from the semiconductor substrate. With this, escaping of the injected carriers from the floating gate electrode is suppressed further, and retention performance of the semiconductor memory device is improved.

For the foregoing another tunneling insulation film used between the first floating gate electrode and the second floating gate electrode, it is preferable to use a very thin chemical oxide film, in view of the need of suppressing the diffusion of the impurity element from the second floating gate electrode to the first floating gate electrode while at the same time maintaining sufficiently small electrical resistance as compared with electrical resistance of the tunneling insulation film formed on the substrate.

According to the present invention, it becomes possible to provide necessary contacts to the direct-tunneling semiconductor memory device by extending the source and drain regions formed on the sidewall surfaces of the device isolation trench up to the surface of the semiconductor substrate.

Further, by forming the device isolation insulation film filling the device isolation groove to have a top surface located at the height exceeding the substrate surface, it becomes possible to planarize the word line formed by the control gate electrodes, and patterning of the word line is substantially facilitated.

With the fabrication process of direct-tunneling semiconductor memory device of the present invention, all the processes for forming the floating gate electrode can be achieved by a self-aligned process except for only one process conducted at the beginning, and thus, the present invention is highly suitable for device miniaturization. Thus, with the fabrication process of the present invention, it becomes possible to fabricate highly miniaturized, high-speed large capacity semiconductor integrated circuit of direct-tunneling semiconductor memory device.

Further, with the present invention, in which the direct tunneling semiconductor memory device is fabricated by forming a tunneling insulation film on a semiconductor substrate; forming a floating gate electrode on said tunneling insulation film; forming a dielectric film on a sidewall surface of said floating gate electrode; forming a conductor pattern constituting a part of a control gate electrode on said sidewall surface of said floating gate electrode via said dielectric film; forming an insulation pattern so as to cover said floating gate electrode including said conductor pattern and so as to expose a part of said semiconductor substrate forming a device isolation region; etching said semiconductor substrate while using said insulation pattern as a mask to form a device isolation trench; depositing a device isolation insulation film on said semiconductor substrate so as to fill said device isolation trench and so as to cover said floating gate electrode and said conductor pattern; etching back said device isolation insulation film until said conductor pattern is exposed; and forming another conductor pattern on said insulation film constituting said control gate electrode such that said another conductor pattern makes contact with said conductor pattern, it is possible to form the foregoing device isolation insulation film with a height exceeding the substrate surface. Further, with such a construction, it becomes possible to reduce the amount of etching and also the duration of etching in the foregoing etch back step. Thereby, it becomes possible to realize the planarization of the semiconductor memory device, and as a result, the process of depositing and patterning a control gate electrode on the floating gate electrode is facilitated substantially.

According to the present invention, the device isolation region is formed in self-alignment with the gate electrode structure that includes therein the floating gate electrode. Further, because the source and drain regions are formed on the sidewall surface of the device isolation region, it becomes possible to reduce the cell size of the semiconductor memory device to the size of 4 $F^2$.

Further, because the present invention can use the process of first forming a shallow device isolation trench for formation of the source and drain regions and then forming a second, deeper device isolation trench, it becomes possible to eliminate the process of etching the insulation film already filling the device isolation trench for exposure of the sidewall surface of the device isolation trench for the purpose of formation of the source and drain regions.

With this, there is no longer the need of etching the insulation film filling the device isolation trench while controlling the depth of the etching, and the fabrication process of the direct-tunneling semiconductor memory device is substantially simplified. Further, because the depth of the device isolation trench formed directly in the substrate for formation of the source and drain regions can be controlled with high precision, it is possible to form the source and drain regions with excellent controllability. Of course, it is possible to form the source and drain diffusion regions before forming any device isolation trench and then form the device isolation trench by a single dry etching process.

Further, according to the present invention, it becomes possible to construct an AND-type semiconductor memory integrated circuit by extending the control gate electrode in the row direction in connection with the control gate electrode of a next memory cell transistor adjacent in the row direction, extending the source region in the column direction in connection with the source region of a next memory cell transistor adjacent in the column direction, and by extending the drain region in the column direction in connection with the drain region of the next memory cell transistor adjacent in the column direction.

Other objects and further features of the present invention will become apparent from the following detailed description when read in conjunction with the attached drawings.

BRIEF DESCRIPTION OF THE DRAWINGS

FIG. 2 is a diagram showing the cell size of the direct-tunneling semiconductor memory device of FIG. 1;

FIGS. 8A-8C are diagrams showing the construction of a direct-tunneling semiconductor memory device according to a third embodiment of the present invention.

DETAILED DESCRIPTION OF THE INVENTION

First Embodiment

FIGS. 3A-3I are diagrams showing the fabrication process of a direct-tunneling semiconductor memory device 60 according to a first embodiment of the present invention.

Figure 1:
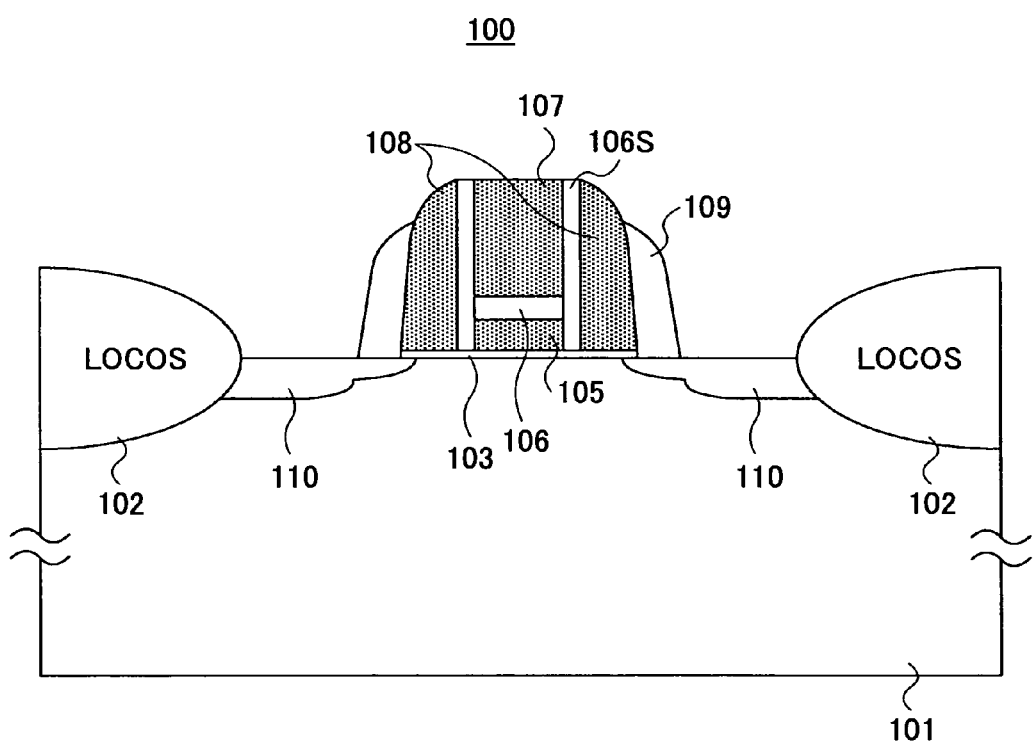
FIG. 1 is a diagram showing the construction of a conventional direct-tunneling semiconductor memory device.
Figure 3A:
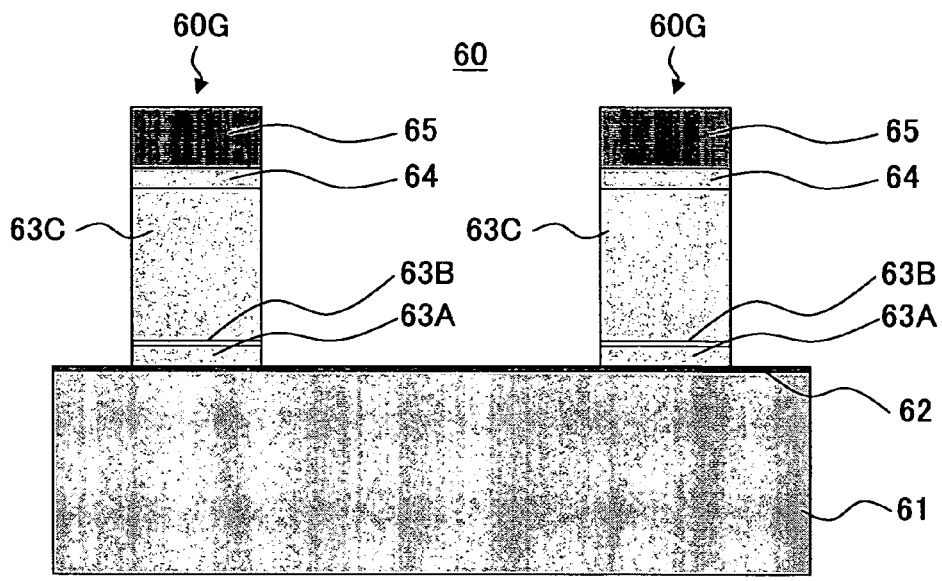
FIGS. 3A-3I are diagrams showing the fabrication process of a direct-tunneling semiconductor memory device according to a first embodiment of the present invention.

Referring to FIG. 3A, ion implantation of B+ is conducted for formation of a p-type well (not shown) and for threshold control, and the injected impurity element is activated by a rapid thermal annealing (RTA) process conducted at 1000° C. for the duration of 10 seconds.

Next, a tunneling oxide film 62 is formed on the silicon substrate 61 by a thermal oxidation processing with the thickness of 1-3 nm, and a polysilicon film 63A constituting a part of the floating gate electrode is deposited by a CVD process with the thickness of 10-30 nm. Further, by processing the surface of the polysilicon film 63A thus formed with a mixture of nitric acid and hydrogen peroxide, a thin chemical oxide film 63B is formed on the polysilicon film 63B.

Further, another polysilicon film 63C forming another part of the floating gate electrode is deposited on the chemical oxide film 63B by a CVD process with the thickness of 150 nm. Further, ion implantation of an n-type impurity element such as P+ is conducted to the polysilicon film 63C thus deposited, followed by activation process of the impurity element thus introduced by conducting an RTA process at 1000° C. for the duration of 10 seconds.

Further, in the step of FIG. 3A, an SiN film 64 used as a hard mask is deposited on the polysilicon film 63C by a CVD process with the thickness of 30-100 nm, and a silicon oxide film 65 is deposited on the SiN film 64 by a CVD process with the thickness of 100 nm. Further, by conducting a lithographic process and an etching process according to the RIE process to the structure thus obtained, a gate structure 60G shown in FIG. 3A is formed.

Figure 3B:
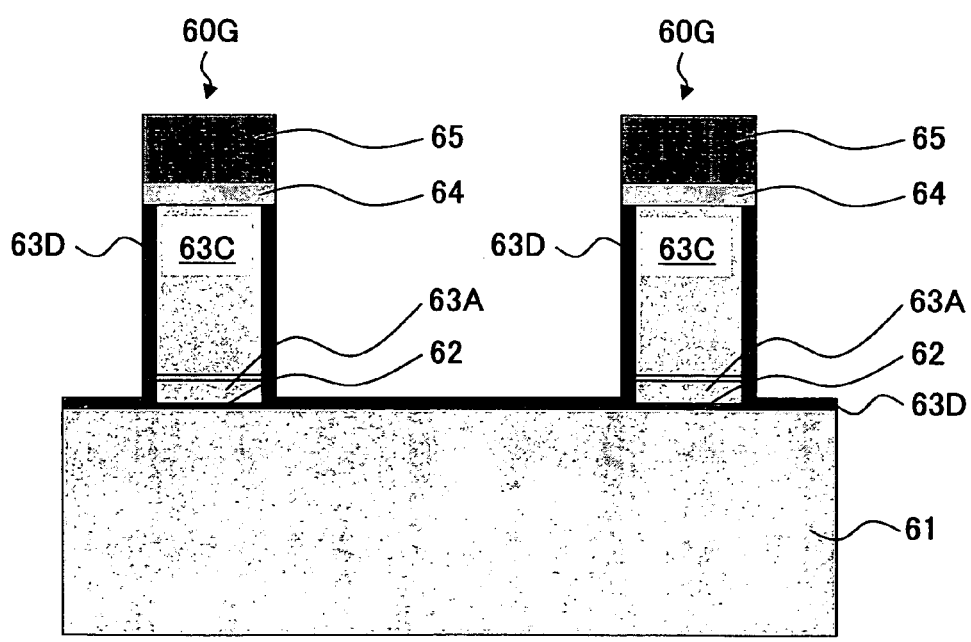

Next, in the step of FIG. 3B, the sidewall surfaces of the polysilicon film 63A and the polysilicon film 63C exposed at the sidewall surface of the gate structure 60G are oxidized by a thermal oxidation process with the thickness of 3-10 nm to form an oxide film 63D. Here, it is also possible to form the oxide film 63D by a CVD process in place of the thermal oxidation process so as to have a thickness of 3-15 nm. In this step of FIG. 3B, it should be noted that there is caused also an increase of thickness in the tunneling insulation film 62 covering the surface of the silicon substrate 61.

Figure 3C:
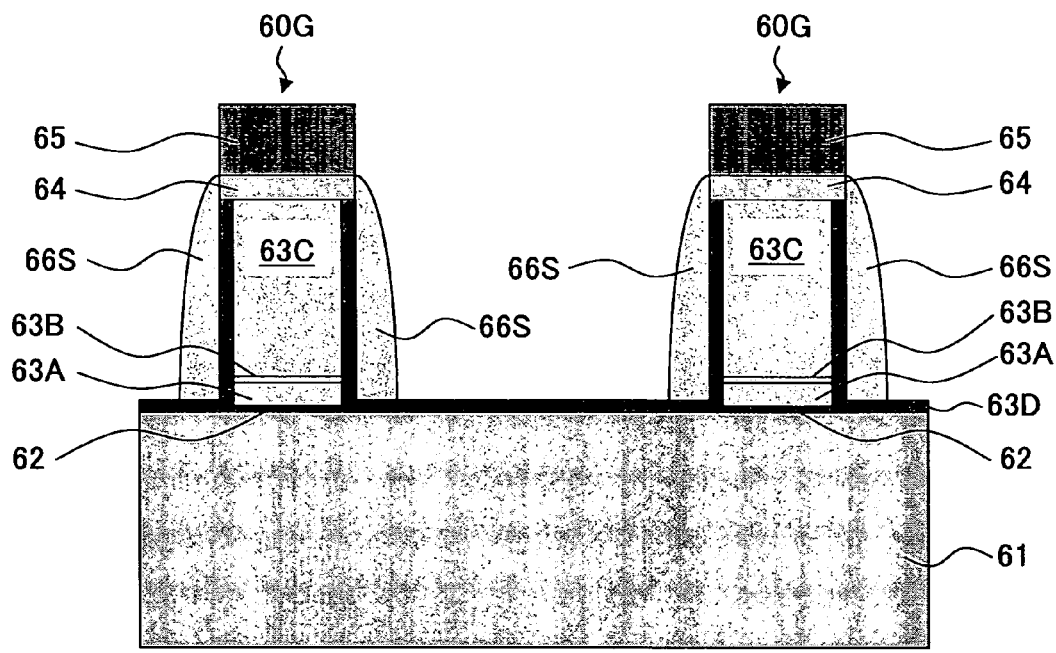

Next, in the step of FIG. 3C, there is formed a polysilicon film corresponding to the control gate electrode by a CVD process with the thickness of 30-100 nm. Further, after activating the impurity element in the polysilicon film with an RTA processing conducted at 1000° C. for 10 seconds, an etch-back process is applied uniformly by a dry etching process to form polysilicon sidewall films 66S at both sidewall surfaces of the gate structure 60G via the oxide film 63D. In the case an LDD region is to be formed in the direct-tunneling semiconductor memory device, ion implantation of an n-type impurity element such as P+ is conducted in the state of FIG. 3C.

Figure 3D:
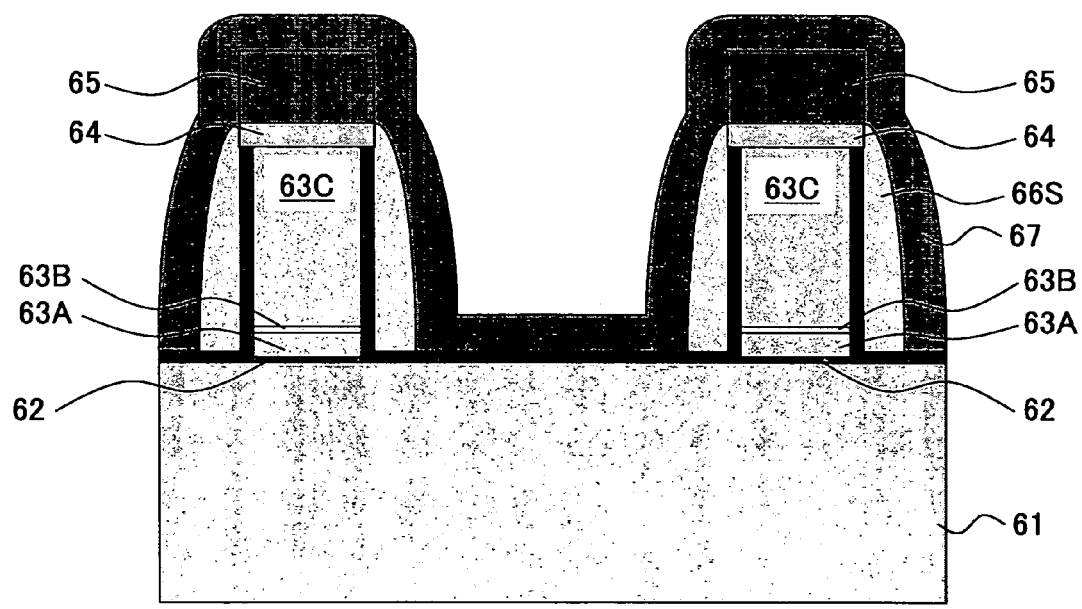
Figure 3E:
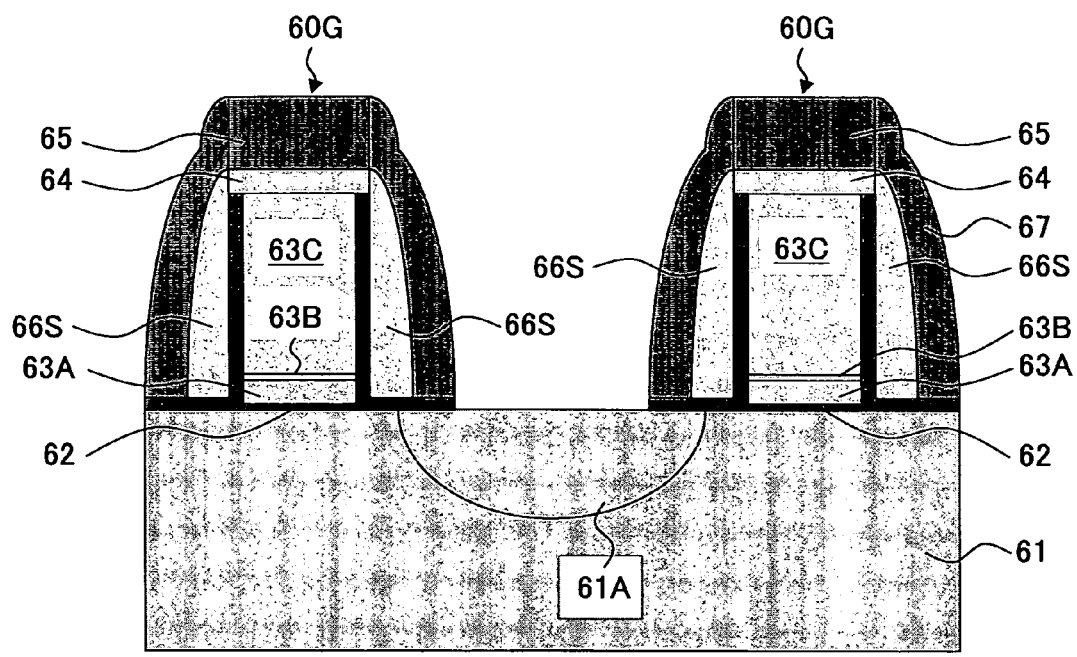

Next, in the step of FIG. 3D, an oxide film 67 for protecting the control gate electrode 66S is deposited by a CVD process with the thickness of 20-50 nm, wherein the oxide film 67 is etched back uniformly in the step of FIG. 3E such that the surface of the silicon substrate 61 is exposed between two neighboring gate structures 60G.

Further, in the step of FIG. 3E, ion implantation of an n-type impurity element such as P+ is conducted for formation of the source and drain regions, wherein the impurity element thus injected is activated by conducting an RTA processing at 1000° C. for 10 seconds. With this, there is formed an n-type diffusion region 61A in the region of the substrate 61 right underneath the control gate electrode 66S in overlapping relationship therewith as a result of diffusion of the impurity element with the thermal annealing process, even in the case the foregoing ion implantation process for forming the LDD region is not achieved. Here, it should be noted that, while the n-type diffusion region 61A is formed right underneath the control gate electrode 66S, the diffusion region 61A is offset from the region right underneath the floating gate electrode 63A.

Figure 3F:
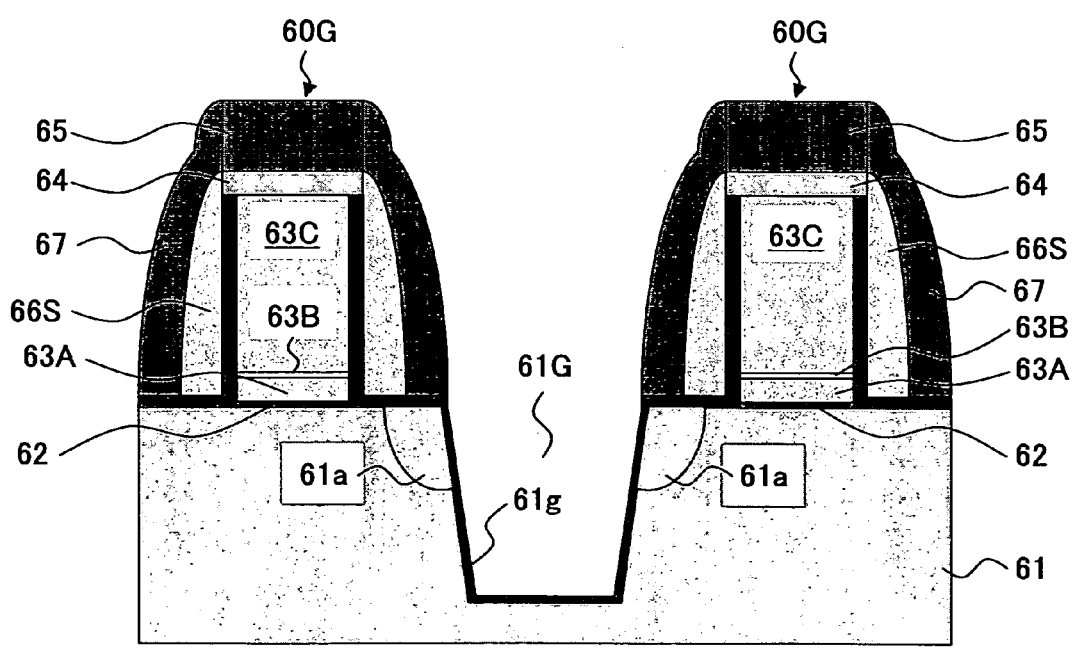

Next, in the step of FIG. 3F, a device isolation trench 61G is formed in the silicon substrate 61 by a self-alignment process conducted by a dry etching process while using the gate structure 60 and the oxide film 67 as a mask, such that the device isolation trench 61G has a depth of 200-400 nm.

Further, after formation of the device isolation trench 61G, the inner wall surface of the device isolation trench 61G is oxidized by a thermal oxidation process to form an oxide film 61g covering the surface of the device isolation trench 61G with the thickness of 5-15 nm. As a result of the formation of the device isolation trench 61G, the n-type diffusion region 61A formed on the surface of the silicon substrate 61 is divided into two regions 61a.

Figure 3G:
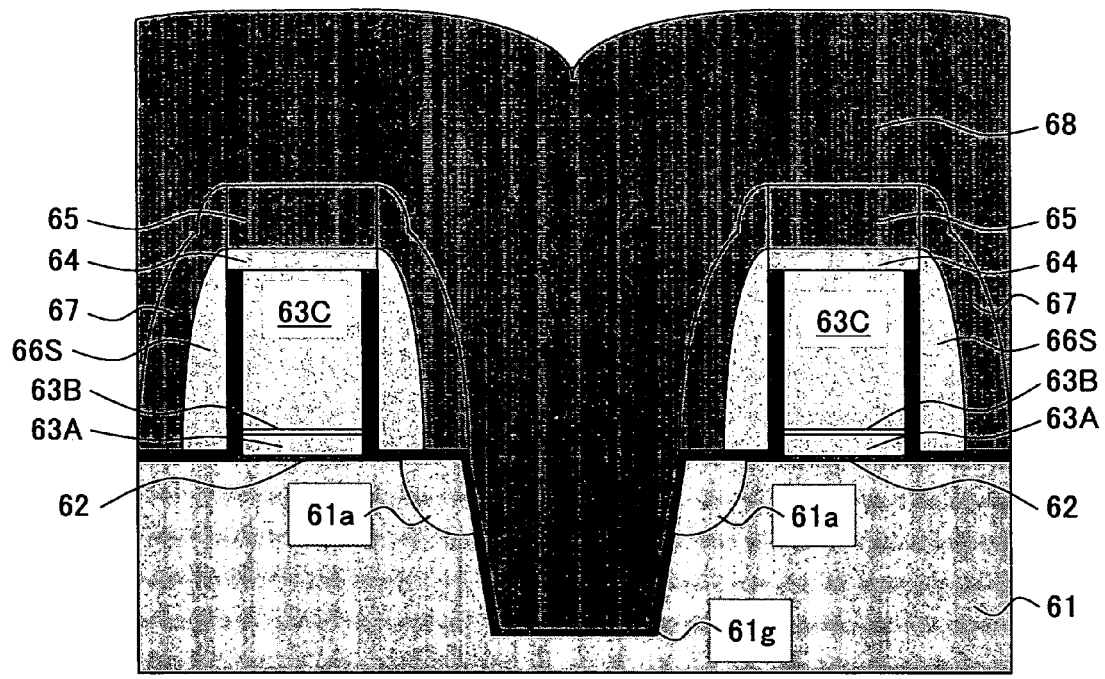

Next, in the step of FIG. 3G, a silicon oxide film 68 is deposited on the structure of FIG. 3F with the thickness of 200-400 nm, followed by an etch back process conducted by a dry etching process, until a part of the control gate electrode 66S, more specifically the SiN hard mask 64 is exposed.

Figure 3H:
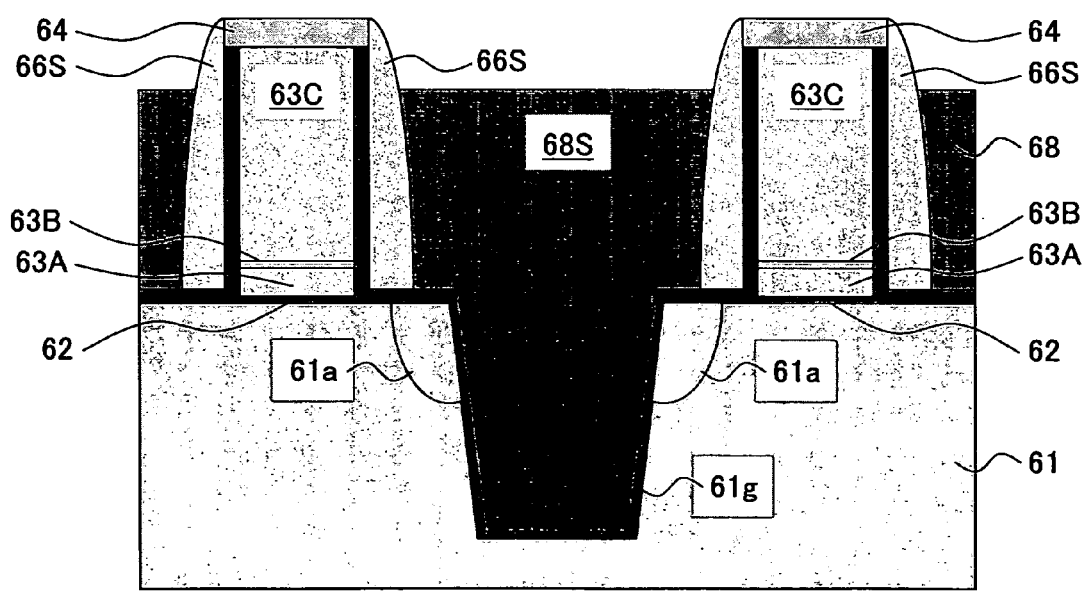

As a result, there is obtained a structure shown in FIG. 3H in which an oxide film pattern 68S forming the device isolation insulation film fills the device isolation trench 61G such that the oxide film pattern 68S reaches a height exceeding the surface of the silicon substrate but not exceeding the height of the top surface of the SiN hard mask pattern 64.

Here, in order to achieve further planarization of the device isolation oxide film 68S, it is also possible to apply a CMP process after formation of the oxide film 68. Alternatively, it is possible to use a low melting insulation film such as a BPSG film having high fluidity and achieve the planarization process by a thermal annealing process.

Figure 3I:
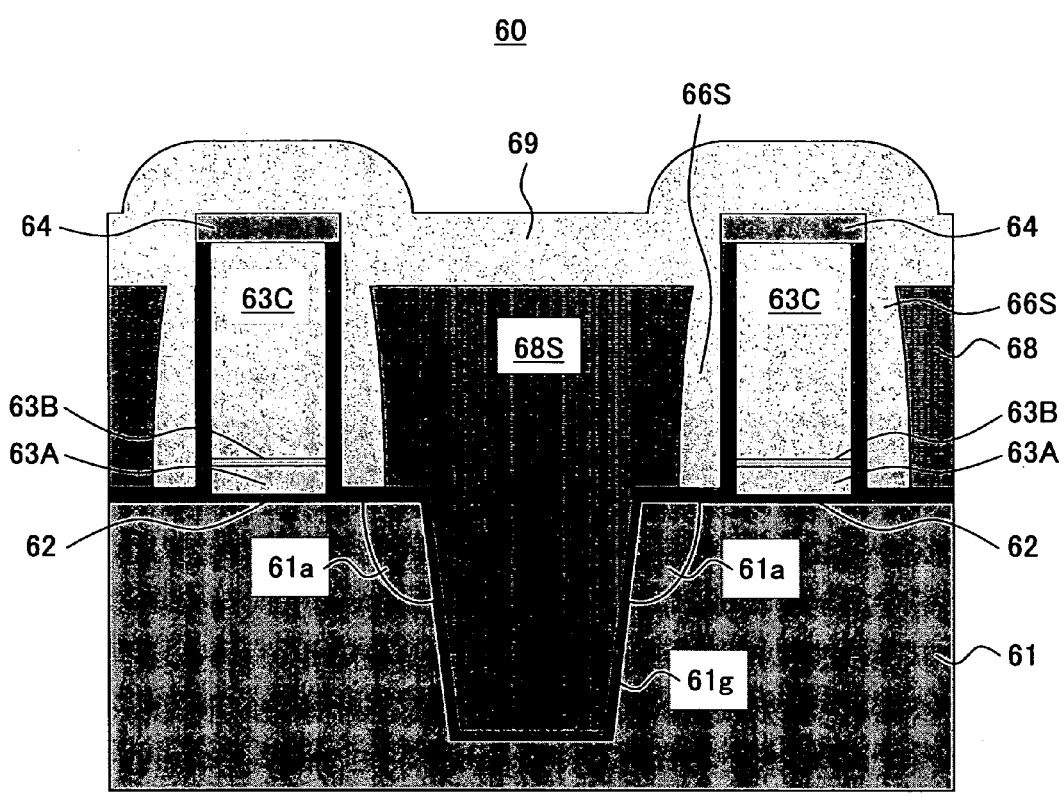

Next, in the step of FIG. 3I, the exposed surface of the polysilicon control gate electrode 66S is processed by a diluted hydrofluoric acid to remove the native oxide film therefrom, and a polysilicon film constituting a control gate electrode 69 and also a part of the word line is deposited by a CVD process with the thickness of 50-100 nm. Thereafter, lithographic process and dry etching process are conducted for patterning the polysilicon film to form the control gate electrode 69.

In order to reduce the contact resistance between the polysilicon control gate electrode 69 and the previously formed polysilicon control gate electrode 69, it is possible to form a silicide layer on the exposed part of the polysilicon gate electrode 66S.

After the step of FIG. 3I, usual processes of forming interlayer insulation films and wiring layers are conducted, and the desired direct-tunneling semiconductor memory device 60 is obtained.

In the present embodiment, a silicon oxide film has been made for the protective film 67 of the polysilicon sidewall films 66S and the device isolation insulation film 68, while the present invention is not limited to such a specific case and it is also possible to use a silicon nitride film. Further, other materials can be used according to the needs.

According to the present invention, in which the control gate electrode 69 is relatively planarized, it becomes possible to achieve the word line patterning easily with high precision by using a high-resolution exposure system.

Figure 4:
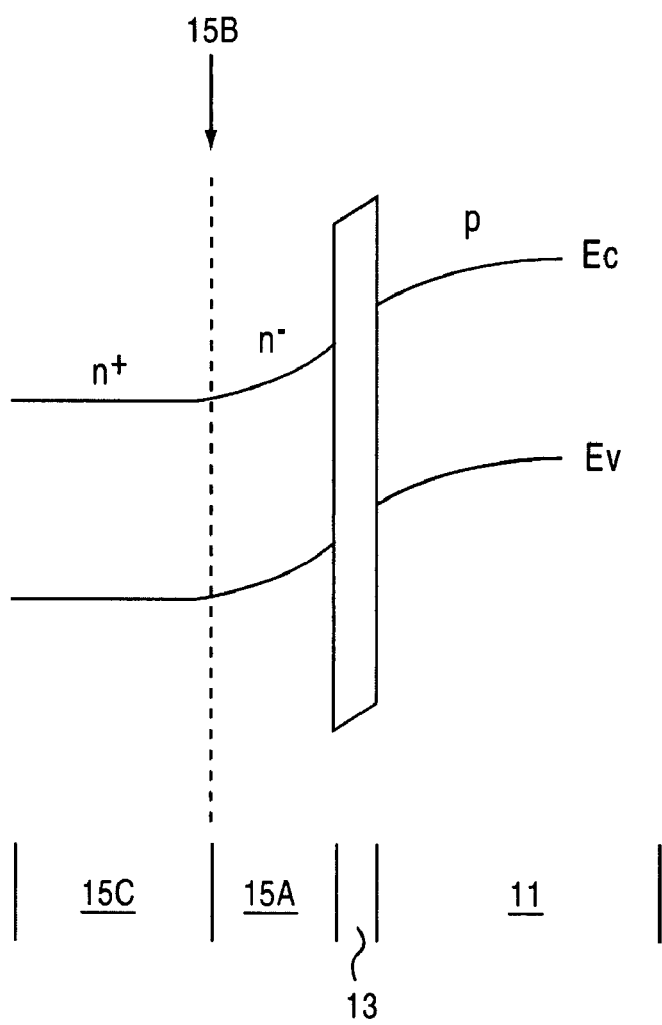
FIG. 4 is a diagram explaining the operation of the direct-tunneling semiconductor memory device of the first embodiment.

FIG. 4 shows the band structure of the direct-tunneling semiconductor memory device 60 of FIG. 3I taken along the cross-section through the silicon substrate 61, the tunneling insulation film 62, and the floating gate electrodes 63A and 63C. In FIG. 4, illustration of the chemical oxide film 63B is omitted.

Referring to FIG. 4, the silicon substrate 61 is doped to the p-type and the floating gate electrode 63C is doped to the n+-type. Thus, there is caused a bend in the conduction band Ec and valence band Ev of the floating gate electrode 63A intervening between the silicon substrate 61 and the floating gate electrode 63C.

With regard to the lower floating gate electrode 63A, it should be noted that the gate electrode 63A itself is formed by an undoped polysilicon film, while because of the diffusion of the n-type impurity element in the n+-type floating gate electrode 63C caused through the thin chemical oxide film 63B, the lower floating gate electrode 63A is in most cases doped to n-type.

Now, when there is caused a band bending in the lower floating gate electrode 63A as shown in FIG. 4, the carries, and thus electrons, are expelled from the lower floating gate electrode 63A and there is caused depletion in the gate electrode 63A. Thereby, the probability of the electrons accumulated in the upper gate electrode 63C escaping to the silicon substrate 61 by tunneling is reduced substantially, and the data retention performance of the direct-tunneling semiconductor memory device is improved. With this, the interval of refreshing operation can be increased.

Figure 5:
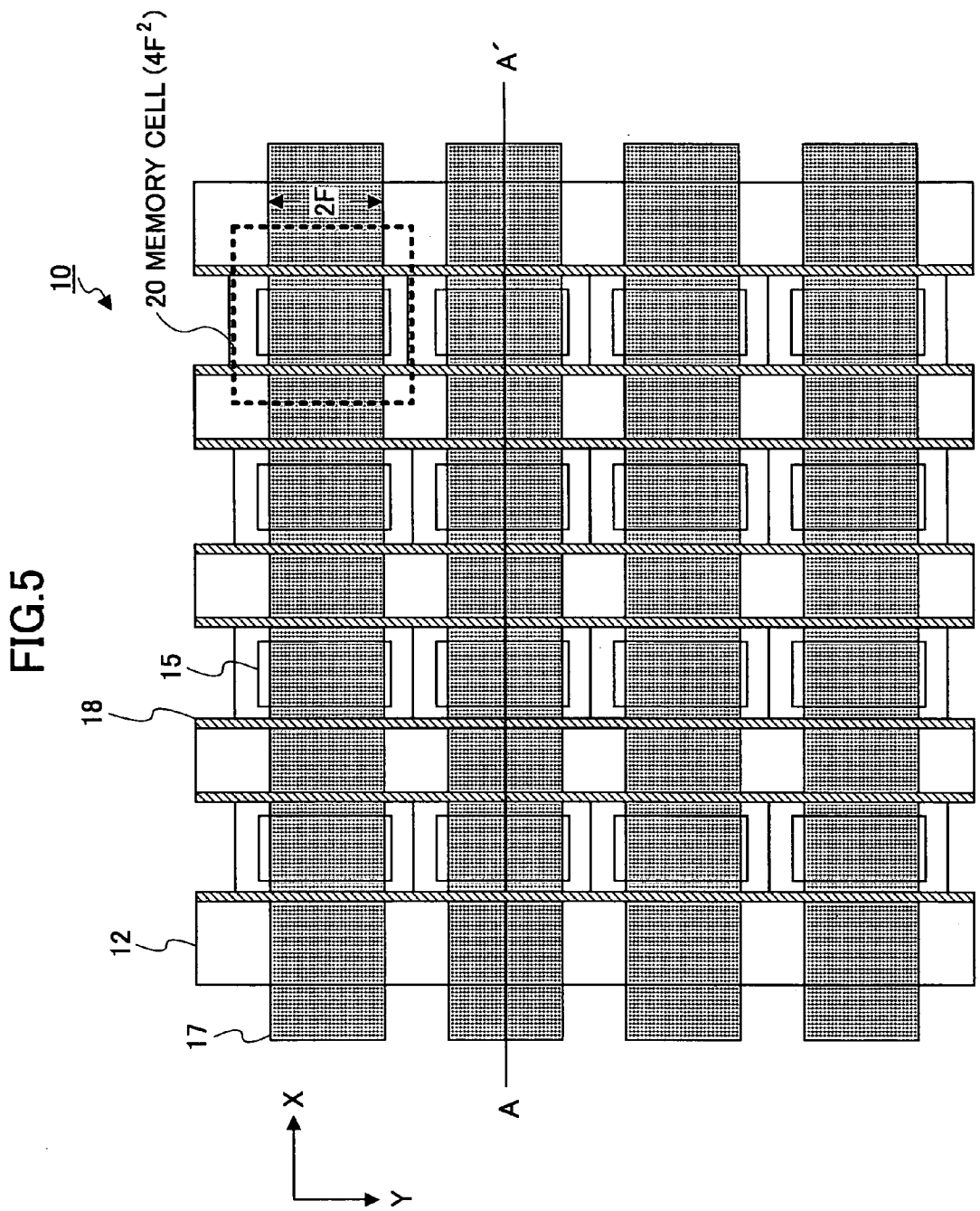
FIG. 5 is a diagram showing the cell size of the semiconductor integrated circuit device formed of the direct-tunneling semiconductor memory device of the first embodiment.

FIG. 5 is a diagram showing the construction of a semiconductor integrated circuit device 10 that uses the direct-tunneling semiconductor memory device 60 of the present invention as a constituent element.

Referring to FIG. 5, the direct-tunneling semiconductor memory device 60 of FIG. 3I constitutes a single memory cell 20 in the integrated circuit device 10, wherein the memory cell 20 includes a floating gate electrode 15 corresponding to the floating gate electrodes 63A and 63B formed in the region between two adjacent bit lines 18, and word lines 17 are provided in correspondence to the control gate electrodes 69 so as to extend in the direction perpendicular to the bit lines 18. Thereby, the memory cell 20 has a size of 4 $F^2$.

Here, it should be noted that this size of 4 $F^2$ of the memory cell 20 is one-half the size 8 $F^2$ of the conventional memory cell explained with reference to FIG. 2, while it should be noted that this reduction of memory cell size has been achieved by the construction of FIG. 3I that uses the device isolation structure of STI type in combination with formation of the bit lines 18 (source and drain diffusion regions 61a) on the upper sidewall surfaces of the device isolation trench constituting the STI structure.

Figure 6:
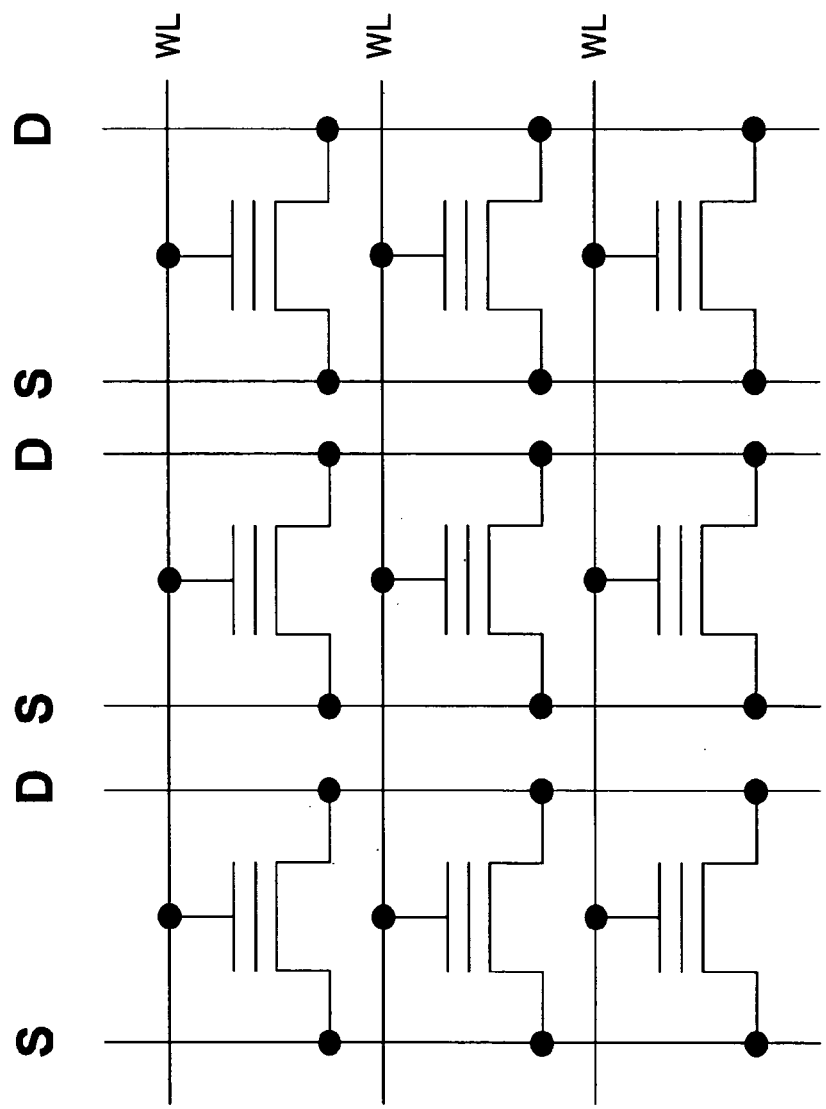
FIG. 6 is a diagram showing the equivalent circuit diagram of the semiconductor-integrated circuit of FIG. 5.

FIG. 6 shows the equivalent circuit diagram corresponding to the integrated circuit device of FIG. 5.

Referring to FIG. 6, a direct-tunneling semiconductor memory devices 60 of FIG. 3I are arranged in row and columns in correspondence to the arrangement of FIG. 5, wherein a direct-tunneling semiconductor memory device 60 in the array is connected to a neighboring direct-tunneling semiconductor memory device 60 in the row direction by connecting the respective control gate electrodes 17 thereof with each other, wherein the control gate electrodes 17 thus connected in the row direction constitutes a word line WL.

Further, a direct-tunneling semiconductor memory device 60 in the array is connected to a next neighboring direct-tunneling semiconductor memory device 60 in the column direction by connecting the respective source regions 18 corresponding to the diffusion region 61a with each other to form a source line S extending in the column direction and by connecting the respective drain regions corresponding to the other diffusion region 61a with each other to form a bit line D extending also in the column direction. Thereby, the construction of FIG. 6 forms an AND-type semiconductor memory integrated circuit device.

Second Embodiment

Figure 7A:
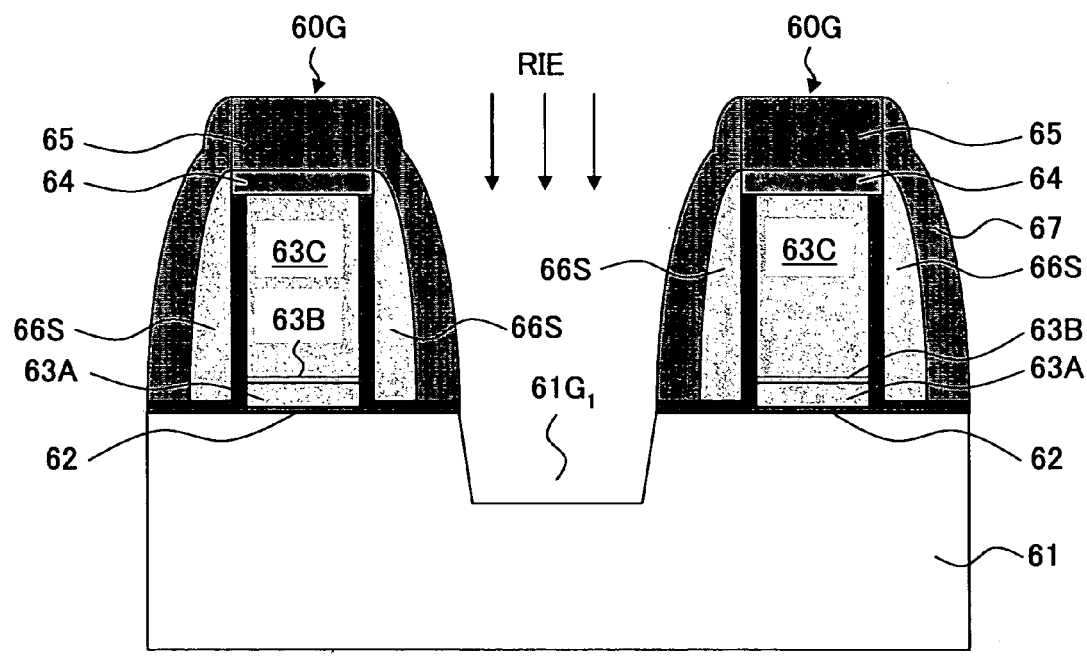
FIGS. 7A and 7B are diagrams showing the fabrication process of the direct-tunneling semiconductor memory device according to a second embodiment of the present invention.
Figure 7B:
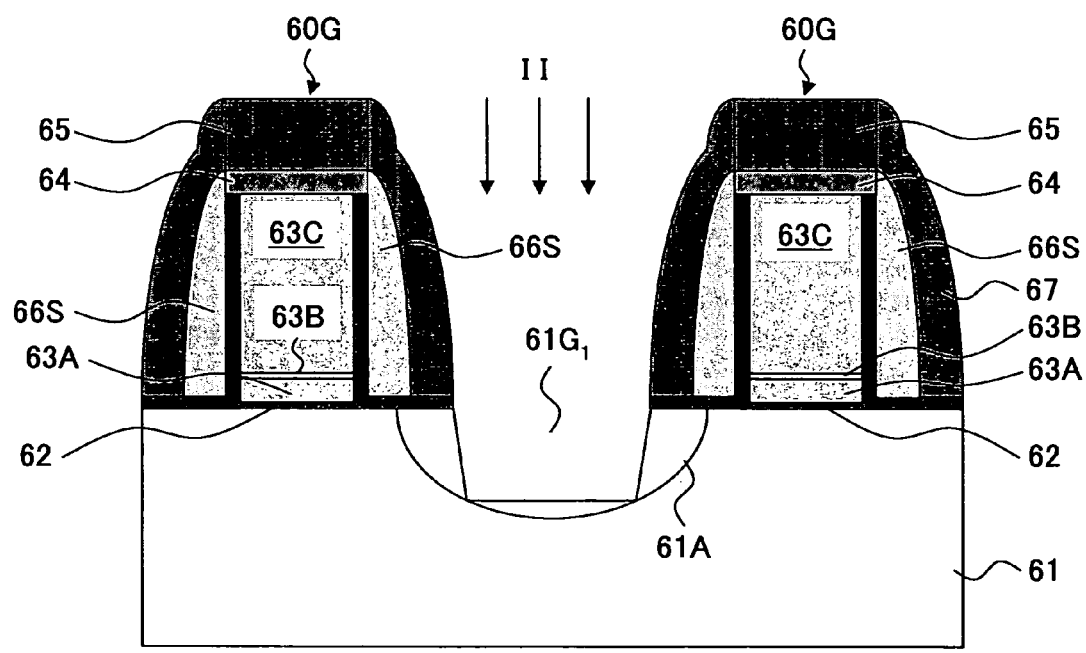

FIGS. 7A and 7B show a part of the fabrication process of the direct-tunneling semiconductor memory device 60 according to a second embodiment of the present invention.

In the present embodiment, the process proceeds, after the step of FIG. 3D, to the step of FIG. 7A, wherein the surface of the silicon substrate 61 is etched with the present embodiment with a limited depth necessary for the formation of the source and drain regions such as the depth of 0-200 nm from the surface of the silicon substrate 61, while using the oxide film 67 as a mask. Thereby, there is formed a first device isolation trench $61G_1$.

For the sake of convenience of explanation, the present embodiment will be explained hereinafter for the case of setting the depth of the first device isolation trench $61G_1$ to 80 nm, while this depth of the first device isolation trench depends on the transistor performance and is not limited to this specific value.

Here, it should be noted that formation of the device isolation trench $61G_1$ on the silicon substrate 61 is a process that can be controlled precisely, and it is possible to set the depth of the trench $61G_1$ to any desired depth within the range of 0-200 nm, according to the requirement of device design. Similarly to the previous embodiment, the first device isolation trench $62G_1$ is formed by a self-aligned process conducted by an RIE process while using the hard mask 65 covering the floating gate electrode 63C and the oxide film 67 as a mask.

Next, in the step of FIG. 7B, an impurity element such as P+ or As+ is injected into the first device isolation trench $61G_1$ by an ion implantation process. Thereby, the ion implantation process is conducted generally perpendicularly to the substrate with the present embodiment. By conducting the ion implantation process in such a vertical direction, it becomes possible to increase the energy of the injected impurity element.

Of course, it is possible also with the present invention to conduct the ion implantation process to the device isolation trench $61G_1$ in an oblique direction to the substrate.

Because the depth of the device isolation trench $61G_1$ formed in the substrate 61 is controlled precisely with the present invention, the region where the ion implantation has been made is determined precisely in any of the cases in which the ion implantation has been made perpendicularly to the substrate and in which the ion implantation has been made obliquely to the substrate.

The impurity element thus introduced cause diffusion in the lateral direction with the thermal annealing process conducted subsequently, and there is formed an impurity diffusion region 61A with the injected impurity element such that the region 61A extends from the sidewall surface of the device isolation trench $61G_1$. For example, in the case the ion implantation is made perpendicularly while using P+ as the impurity element, the acceleration voltage may be set to 60 keV and the ion implantation may be conducted with the dose of $4 \times 10^{15}$ $cm^{-2}$.

Next, in the present embodiment, an RIE process is conducted after the step of FIG. 7B while using the hard mask pattern 65 and the sidewall oxide film 67 as a mask to increase the depth of the device isolation trench $61G_1$, such that the device isolation trench 61G is formed in alignment with the device isolation trench $61G_1$.

Thus, the device isolation trench 61G is formed with the present embodiment by digging the device isolation trench $61G_1$ further in the depth direction, wherein the device isolation trench 61G is formed finally with the depth of 200-400 nm, more preferably with the depth of 300-400 nm, such that the device isolation trench 61G includes therein the first device isolation trench $61G_1$.

With this, the structure explained previously with reference to FIG. 3F is obtained.

Further, by conducting the steps of FIGS. 3G and 3H thereafter, the direct-tunneling semiconductor memory device 60 of FIG. 3I is obtained.

In the present embodiment, the impurity element diffusion region formed at the bottom of the first device isolation trench 61G$_1$ is removed with the subsequent process of FIG. 3F with the formation of the device isolation groove 61G, and thus, it is not necessary in the step of FIG. 7B to control the acceleration energy at the time of the ion implantation process.

Third Embodiment

FIGS. 8A-8C are diagrams showing the construction of a direct-tunneling semiconductor memory device 80 in which there is provided a contact structure to the source/drain regions 61a in the direct-tunneling semiconductor memory device 60 of FIG. 3I, wherein FIG. 8B shows the cross-sectional view taken along a line A-A' in FIG. 8A, while FIG. 8C shows the cross-sectional view taken along a line B-B'. It should be noted that the cross-section of FIG. 8B corresponds to the cross-section of FIG. 3I. In the drawings, those parts corresponding to the parts described previously are designated by the same reference numerals and the description thereof will be omitted.

Referring to FIG. 8A, the diffusion region 61a forming the source region and the drain region extend in the column direction on the silicon substrate 61 along the device isolation structure 68S similarly to the case of FIG. 5, wherein a diffusion region 61T of increased area is provided at an end part of the diffusion region 61a as a lead part for contact with a contact structure.

Referring to FIG. 8C, it will be noted that the device isolation structure 68S is formed so as to expose the silicon substrate surface with increased area at the foregoing end part, and the lead diffusion region 61T is formed in such an exposed silicon surface by the ion implantation process forming the diffusion region 61a.

Thus, as shown in FIG. 8C, it becomes possible to connect an interconnection pattern such as a multilayer interconnection structure to such a diffusion region 61a by forming an interlayer insulation film 70 on the silicon substrate 61, forming a contact hole exposing the lead diffusion region 61T in the interlayer insulation film, and forming a contact plug in such a contact hole.

Further, the present invention is not limited to the embodiments described heretofore, but various variations and modifications may be made without departing from the scope of the invention.

What is claimed is:

1. A direct-tunneling semiconductor memory device, comprising:

a semiconductor substrate;

a device isolation structure formed on said semiconductor substrate, including a device isolation trench formed in said semiconductor substrate and a device isolation insulation film filling said device isolation trench, said device isolation structure defining a device region on a semiconductor substrate surface;

a tunneling insulation film formed on said semiconductor substrate surface in correspondence to said device region;

a floating gate electrode formed on said tunneling insulation film;

a dielectric film covering both sidewall surfaces and a top surface of said floating gate electrode;

a conductive part provided on said sidewall surfaces of said floating gate electrode via said dielectric film, said conductor part constituting a part of a control gate electrode; and first and second diffusion regions formed in said device region at respective lateral sides of said floating gate electrode, said first and second diffusion regions being formed in said device region on a surface of said device isolation groove with offset from a region right underneath said floating gate electrode, said conductive part being formed in said device region with offset from said device isolation trench.

2. The direct-tunneling semiconductor memory device as claimed in claim 1, wherein there is formed a conductor pattern on a top surface of said floating gate electrode via said dielectric film, and wherein said conductor pattern forms, together with said conductive part, said control gate electrode.

3. The direct-tunneling semiconductor memory device as claimed in claim 2, wherein said device isolation insulation film extends in an upward direction from said semiconductor substrate surface, said device isolation insulation film having a top surface in the vicinity of said top surface of said floating gate electrode.

4. The direct-tunneling semiconductor memory device as claimed in claim 3, wherein said top surface of said device isolation insulation film is formed with a height not exceeding a height of said top surface of said floating gate electrode.

5. The direct-tunneling semiconductor memory device as claimed in claim 2, wherein said conductive part extends along said sidewall surface of said floating gate electrode between said dielectric film and said device isolation insulation film.

6. The direct-tunneling semiconductor memory device as claimed in claim 3, wherein said conductive pattern extends on a top surface of said device isolation insulation film.

7. The direct-tunneling semiconductor memory device as claimed in claim 1, wherein said dielectric film comprises a thermal oxide film covering said sidewall surfaces of said floating gate electrode and a silicon nitride film covering said top surface of said floating gate electrode.

8. The direct-tunneling semiconductor memory device as claimed in claim 1, wherein said floating gate electrode comprises a first electrode part adjacent to said tunneling insulation film and a second electrode part formed on said first electrode part via another tunneling insulation film.

9. An AND-type semiconductor memory integrated circuit comprising a semiconductor substrate and a plurality of memory cell transistors forming an array on said semiconductor substrate, each of said plurality of memory cell transistors comprising:

a device isolation structure formed on said semiconductor substrate, including a device isolation trench formed in said semiconductor substrate and a device isolation insulation film filling said device isolation trench, said device isolation structure defining a device region on a semiconductor substrate surface;

a tunneling insulation film formed on said semiconductor substrate surface in correspondence to said device region;

a floating gate electrode formed on said tunneling insulation film;

a dielectric film covering both sidewall surfaces and a top surface of said floating gate electrode;

a conductive part provided on said sidewall surfaces of said floating gate electrode via said dielectric film, said conductor part constituting a part of a control gate electrode; and source and drain regions formed in said device region at respective lateral sides of said floating gate electrode, said source and drain regions being formed in said device region on a surface of said device isolation groove with offset from a region right underneath said floating gate electrode, said conductive part being formed in said device region with offset from said device isolation trench, a control gate electrode of a memory cell transistor in said array being connected to a control gate electrode of a memory cell transistor of said array adjacent in a row direction on said semiconductor substrate, a source region of a memory cell transistor in said array extending to a source region of a memory cell transistor of said array adjacent in a column direction on said semiconductor substrate, a drain region of a memory cell transistor in said array extending to a drain region of a memory cell transistor of said array adjacent in a column direction on said semiconductor substrate.

10. A direct-tunneling semiconductor memory device, comprising:

a semiconductor substrate;

a device isolation region formed on said semiconductor substrate so as to define a device region, said device isolation region comprising a device isolation trench in said semiconductor substrate and a device isolation insulation film filling said device isolation trench;

a tunneling insulation film formed on a surface of said semiconductor substrate in said device region;

a floating gate electrode formed on said tunneling insulation film;

a dielectric film covering both sidewall surfaces and a top surface of said floating gate electrode;

a control gate electrode formed on said sidewall surfaces and said top surface of said floating gate electrode via said dielectric film; and first and second diffusion regions formed in said device region, said first and second diffusion regions being formed in said device region on a surface of said device isolation trench in self-alignment with said floating gate electrode.

* * * * *